US010636475B2

(12) United States Patent
    Jun

(10) Patent No.: US 10,636,475 B2
(45) Date of Patent: Apr. 28, 2020

(54) MEMORY DEVICE FOR RECEIVING OPERATION CODES THROUGH DQ PINS, A MEMORY MODULE INCLUDING THE SAME, AND A SETTING METHOD OF THE MEMORY MODULE

(71) Applicant: SAMSUNG ELECTRONICS CO., LTD., Suwon-si, Gyeonggi-Do (KR)

(72) Inventor: In-Woo Jun, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/052,815

(22) Filed: Aug. 2, 2018

(65) Prior Publication Data
    US 2019/0206478 A1    Jul. 4, 2019

(30) Foreign Application Priority Data
    Dec. 28, 2017 (KR) .................. 10-2017-0182039

(51) Int. Cl.
    *G11C 11/4076* (2006.01)
    *G11C 11/4093* (2006.01)
    *G06F 13/40* (2006.01)
    *G11C 5/04* (2006.01)
    *G11C 11/4096* (2006.01)
    (Continued)

(52) U.S. Cl.
    CPC ...... *G11C 11/4076* (2013.01); *G06F 13/4068* (2013.01); *G11C 5/04* (2013.01); *G11C 7/02* (2013.01); *G11C 7/1045* (2013.01); *G11C 7/1048* (2013.01); *G11C 11/4093* (2013.01); *G11C 11/4096* (2013.01); *G11C 2207/105* (2013.01); *G11C 2207/107* (2013.01)

(58) Field of Classification Search
    CPC ............ G11C 11/4076; G11C 11/4096; G11C 29/023; G11C 7/1078; G11C 7/22; G11C 11/4093; G06F 13/4068
    See application file for complete search history.

(56) References Cited

U.S. PATENT DOCUMENTS

6,853,317 B2   2/2005 Kim et al.
7,804,720 B2   9/2010 Lee et al.
(Continued)

FOREIGN PATENT DOCUMENTS

KR   10-0967105   7/2010
KR   10-1124284   3/2012

*Primary Examiner* — Gene N Auduong
(74) *Attorney, Agent, or Firm* — F. Chau & Associates, LLC

(57) ABSTRACT

A memory device including: a memory cell array; a first data input/output pin through which a first signal is input or output, wherein the first signal includes first bits to be written in the memory cell array or output from the memory cell array; a second data input/output pin through which a second signal is input or output, wherein the second signal includes second bits to be written in the memory cell array or output from the memory cell array; a first receiver configured to receive first operation codes for the first signal through the first data input/output pin; a second receiver configured to receive second operation codes for the second signal through the second data input/output pin; a first mode register configured to store the first operation codes; and a second mode register configured to store the second operation codes.

20 Claims, 13 Drawing Sheets

(51) Int. Cl.
  *G11C 7/02*       (2006.01)
  *G11C 7/10*       (2006.01)

(56) References Cited

U.S. PATENT DOCUMENTS

| | | | |
|---|---|---|---|
| 8,194,493 B2 * | 6/2012 | Ware | G11C 5/14 |
| | | | 365/230.03 |
| 8,307,270 B2 * | 11/2012 | Kim | G06F 11/1028 |
| | | | 365/120 |
| 8,737,143 B2 | 5/2014 | Kondo | |
| 8,817,573 B2 | 8/2014 | Ku | |
| 9,257,159 B2 * | 2/2016 | Ware | G11C 5/14 |
| 9,280,415 B2 | 3/2016 | Ok | |
| 10,186,309 B2 * | 1/2019 | Oh | G06F 11/1004 |
| 2012/0300570 A1 * | 11/2012 | Kim | G06F 11/1028 |
| | | | 365/222 |
| 2014/0244922 A1 | 8/2014 | Bains et al. | |

\* cited by examiner

MEMORY DEVICE FOR RECEIVING OPERATION CODES THROUGH DQ PINS, A MEMORY MODULE INCLUDING THE SAME, AND A SETTING METHOD OF THE MEMORY MODULE

CROSS-REFERENCE TO RELATED APPLICATION

This U.S. non-provisional application claims priority under 35 U.S.C. § 119 to Korean Patent Application No. 10-2017-0182039 filed on Dec. 28, 2017, in the Korean Intellectual Property Office, the disclosure of which is incorporated by reference herein in its entirety.

Technical Field

Exemplary embodiments of the inventive concept described herein relate to a memory device, a memory module including the same, and an operating method of the memory module.

Discussion Of Related Art

A memory device may include mode registers for storing setting values associated with modes of operation. For example, a first setting value may correspond to a first operation mode and a second setting value may correspond to a second operation mode. A user may set and use various operation modes by adjusting the setting values of the mode registers. Before data is input to or output from the memory device, the mode registers are set.

As memory device technology advances, memory devices are capable of supporting an increasing number of functions. In particular, as an operating speed of a memory device increases, the memory device may support various modes of operation associated with a high-speed interface. In this case, a time taken to set mode registers of the memory device may increase. When plural memory devices are used, a time taken to set their mode registers may further increase. Accordingly, there is a need to reduce a time taken to set the mode registers of a memory device.

SUMMARY

According to an exemplary embodiment of the inventive concept, a memory device may include a memory cell array; a first data input/output pin through which a first signal is input or output, wherein the first signal includes first bits to be written in the memory cell array or output from the memory cell array; a second data input/output pin through which a second signal is input or output, wherein the second signal includes second bits to be written in the memory cell array or output from the memory cell array; a first receiver configured to receive first operation codes for the first signal through the first data input/output pin; a second receiver configured to receive second operation codes for the second signal through the second data input/output pin; a first mode register configured to store the first operation codes; and a second mode register configured to store the second operation codes.

According to an exemplary embodiment of the inventive concept, a memory module may include a first memory device including a first memory cell array and first data input/output pins through which first signals are input or output, wherein the first signals include first bits to be written in the first memory cell array or output from the first memory cell array; and a second memory device including a second memory cell array and second data input/output pins through which second signals are input or output, wherein the second signals include second bits to be written in the second memory cell array or output from the second memory cell array, wherein the first memory device is configured to store first operation codes transmitted through the first data input/output pins, in response to a mode register update command, and wherein the second memory device is configured to store second operation codes transmitted through the second data input/output pins, in response to the mode register update command.

According to an exemplary embodiment of the inventive concept, a setting method of a memory module which includes a first memory device including a first command pin and a first data input/output pin and a second memory device including a second command pin and a second data input/output pin may include transmitting a mode register update command to the first command pin and the second command pin; transmitting first operation codes to the first data input/output pin, wherein the first operation codes are associated with a first signal input or output through the first data input/output pin; and transmitting second operation codes to the second data input/output pin, wherein the second operation codes are associated with a second signal input or output through the second data input/output pin.

According to an exemplary embodiment of the inventive concept, a memory device includes a command pin for receiving a mode register update command at a first time point; a data strobe pin for receiving a data strobe signal at a second time point after the first time point; a data input/output pin for receiving an operation code at the second time point; and a mode register for storing the operation code, wherein the command pin receives a mode register write command at a third time point after the second time point, and the mode register stores the operation code based on at logical state of the data strobe signal at the third time point, and the mode register write command at the third time point.

BRIEF DESCRIPTION OF THE FIGURES

The above and other features of the inventive concept will become apparent by describing in detail exemplary embodiments thereof with reference to the accompanying drawings.

DETAILED DESCRIPTION OF THE EMBODIMENTS

Figure 1:
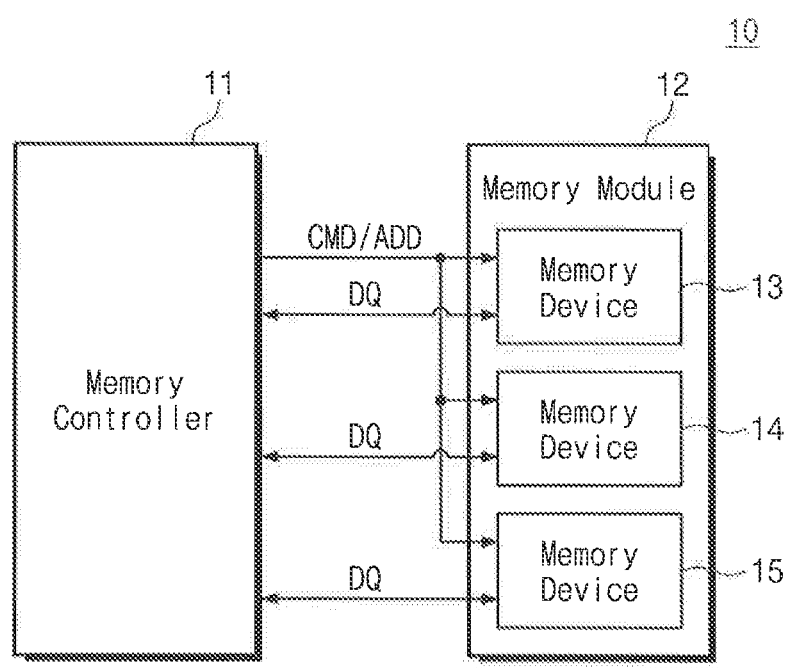
FIG. 1 is a block diagram illustrating a memory system according to an exemplary embodiment of the inventive concept.

Below, exemplary embodiments of the inventive concept will be described in conjunction with the accompanying drawings in which like reference numerals may refer to like elements.

FIG. 1 is a block diagram illustrating a memory system according to an exemplary embodiment of the inventive concept. Referring to FIG. 1, a memory system 10 may include a memory controller 11 and a memory module 12.

The memory controller 11 may transmit command and address signals CMD/ADD to the memory module 12 and may control the memory module 12. The memory controller 11 may exchange data with the memory module 12 by transmitting a command CMD and an address ADD to the memory module 12. For example, the memory controller 11 may exchange DQ signals DQ with the memory module 12.

The memory controller 11 may control the memory module 12 in response to a request of a processor supporting various applications, such as a server application, a personal computer (PC) application, a mobile application, etc. The memory controller 11 may be included in a host including a processor and may control the memory module 12 in response to a request of the processor.

The memory module 12 may include first, second and third memory devices 13, 14 and 15. The first to third memory devices 13 to 15 may receive a command CMD and an address ADD from the memory controller 11 and may exchange respective DQ signals with the memory controller 11. For example, the first memory device 13 may exchange DQ signals with the memory controller 11 in response to the command CMD and the address ADD. Like the first memory device 13, each of the second and third memory devices 14 and 15 may exchange DQ signals with the memory controller 11.

Referring to FIG. 1, transmission paths for the command and address signals CMD/ADD and the DQ signals may be respectively provided between the memory controller 11 and the memory module 12. For example, the first to third memory devices 13 to 15 may share the transmission path for the command and address signals CMD/ADD but may not share the transmission paths for the DQ signals. In other words, the first to third memory devices 13 to 15 may have their own paths for transmission of the DQ signals.

In an exemplary embodiment of the inventive concept, before the memory controller 11 transmits a write command or a read command to the memory module 12, the memory controller 11 may set or update respective operation modes of the first to third memory devices 13 to 15. The memory controller 11 may independently set the respective operation modes of the first to third memory devices 13 to 15. For high-speed data input/output, the memory controller 11 may independently set respective modes of operation for the DQ signals of the first memory device 13. The memory controller 11 may also independently set respective modes of operation for the DQ signals of the second memory device 14 and respective modes of operation for the DQ signals of the third memory device 15.

In an exemplary embodiment of the inventive concept, the number of memory devices of the memory module 12 is not limited to that illustrated in FIG. 1. For example, the number of memory devices may be less than three or greater than three. The memory module 12 may be any device including a plurality of memory devices. For example, the memory module 12 may be a memory package.

Figure 2:
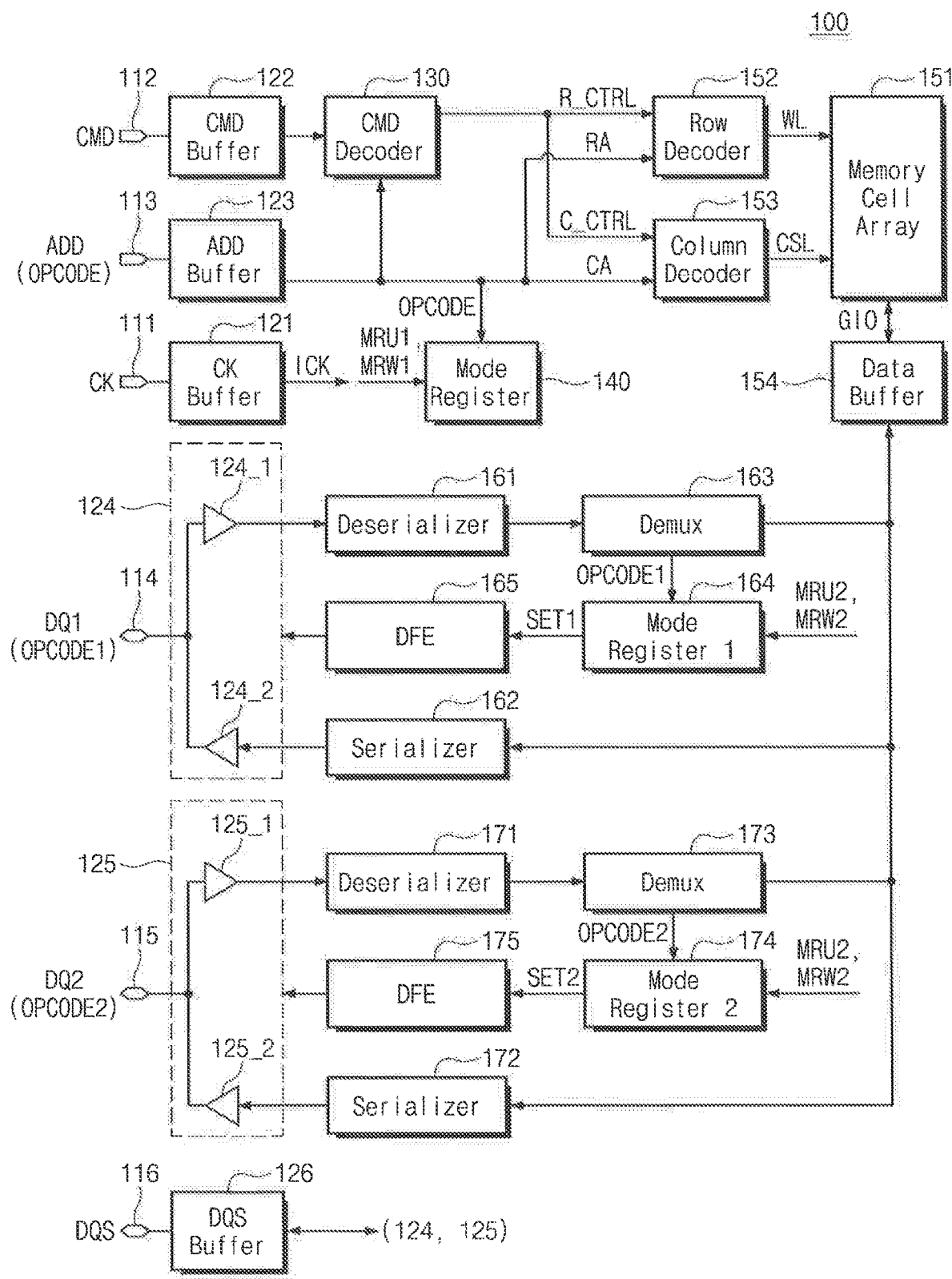
FIG. 2 is a block diagram illustrating a memory device of FIG. 1, according to an exemplary embodiment of the inventive concept.

FIG. 2 is a block diagram illustrating a memory device of FIG. 1, according to an exemplary embodiment of the inventive concept. FIG. 2 will be described with reference to FIG. 1. A memory device 100 of FIG. 2 may be any one of the first to third memory devices 13 to 15 of FIG. 1. Referring to FIG. 2, the memory device 100 may include a clock pin 111, a command pin 112, an address pin 113, a first DQ pin 114, a second DQ pin 115, a clock buffer 121, a command buffer 122, an address buffer 123, a first DQ buffer 124, a second DQ buffer 125, a command decoder 130, a mode register 140, a memory cell array 151, a row decoder 152, a column decoder 153, a data buffer 154, a first deserializer 161, a first serializer 162, a first demultiplexer 163, a first mode register 164, a first decision feedback equalizer (DFE) 165, a second deserializer 171, a second serializer 172, a second demultiplexer 173, a second mode register 174, and a second DFE 175.

The clock pin 111 may be a terminal for receiving a clock signal CK from outside the memory device 100 (e.g., from the memory controller 11 of FIG. 1, a host, etc.). The clock signal CK may be a unidirectional signal input only to the memory device 100, and the clock pin 111 may be an input terminal.

The command pin 112 may be a terminal for receiving the command CMD from outside the memory device 100. The command CMD may be a unidirectional signal input only to the memory device 100, and the command pin 112 may be an input terminal. For convenience of description, only one command pin 112 is illustrated, but the number of command pins may be more than one.

The address pin 113 may be a terminal for receiving the address ADD from outside the memory device 100. The address ADD may be a unidirectional signal input only to the memory device 100, and the address pin 113 may be an input terminal. The address pin 113 may receive operation codes OPCODE for setting an operation mode of the memory device 100. The address pin 113 may receive a row address RA and a column address CA indicating locations of memory cells in the memory cell array 151.

For convenience of description, only one address pin 113 is illustrated, but the number of address pins may be more than one. In an exemplary embodiment of the inventive concept, the memory device 100 may include at least one CA pin for receiving both a command and an address for reducing the number of command pins and the number of address pins.

The first and second DQ pins 114 and 115 may be terminals for receiving first and second DQ signals DQ1 and DQ2 from outside the memory device 100 or for outputting the first and second DQ signals DQ1 and DQ2 to the outside of the memory device 100. The number of the first and second DQ pins 114 and 115 (i.e., the number of DQ signals) may be determined in compliance with various protocols. A configuration of the memory device 100 may be determined depending on the number of the first and second DQ pins 114 and 115. For example, the memory device 100 may support configurations of ×4, ×8, ×16, ×32, ×64, ×128, etc.

The first and second DQ signals DQ1 and DQ2 may include bits of write data to be written in the memory cell array 151 according to a write command. The first and second DQ signals DQ1 and DQ2 may include bits of read data output from the memory cell array 151 according to a read command. The first and second DQ signals DQ1 and DQ2 may be bidirectional signals input to the memory device 100 or output from the memory device 100. In other words, the first and second DQ pins 114 and 115 may be data input/output terminals.

In an exemplary embodiment of the inventive concept, the memory device 100 may receive first operation codes OPCODE1 for the first DQ signal DQ1 through the first DQ pin 114. The memory device 100 may receive second operation codes OPCODE2 for the second DQ signal DQ2 through the second DQ pin 115. The memory device 100 may receive the first and second DQ signals DQ1 and DQ2 including bits of write data through the first and second DQ pins 114 and 115. The memory device 100 may receive the first and second DQ signals DQ1 and DQ2 respectively including the first and second operation codes OPCODE1 and OPCODE2 through the first and second DQ pins 114 and 115.

As described above, the operation codes OPCODE received through the address pin 113 may include information for setting an operation mode of the memory device 100. As information about the first DQ signal DQ1, the first operation codes OPCODE1 may be different from the operation codes OPCODE received through the address pin 113 and the second operation codes OPCODE2 received through the second DQ pin 115. As information about the second DQ signal DQ2, the second operation codes OPCODE2 may be different from the operation codes OPCODE received through the address pin 113 and the first operation codes OPCODE1 received through the first DQ pin 114. The memory device 100 according to an exemplary embodiment of the inventive concept may independently set the first and second DQ signals DQ1 and DQ2 in advance for a high-speed interface. To accomplish this, the memory device 100 may respectively receive the first and second operation codes OPCODE1 and OPCODE2 through the first and second DQ pins 114 and 115, not the address pin 113. When the memory device 100 includes more DQ pins, the memory device 100 may receive more operation codes through respective DQ pins.

In an exemplary embodiment of the inventive concept, the memory device 100 may further include a DQS pin 116 for receiving a data strobe signal DQS from outside the memory device 100. The DQS pin 116 may also be used for outputting the data strobe signal DQS to the outside of the memory device 100. A DQS buffer 126 may be connected to the DQS pin 116. The data strobe signal DQS may be a signal for sampling the first and second DQ signals DQ1 and DQ2.

The clock buffer 121 may operate as a receiver (RX) that receives the clock signal CK. The clock buffer 121 may receive the clock signal CK and may output an internal clock signal ICK to the inside of the memory device 100. For example, when the memory device 100 is a synchronous dynamic random access memory (SDRAM), the memory device 100 may process a command based on the clock signal CK input through the clock pin 111.

The command buffer 122 may operate as a receiver that receives the command CMD. The command buffer 122 may sample the command CMD at a rising edge or a falling edge of the internal clock signal ICK. The command buffer 122 may transmit the sampled command to the command decoder 130.

The address buffer 123 may operate as a receiver that receives the address ADD. The address buffer 123 may sample the address ADD at the rising edge or the falling edge of the internal clock signal ICK. The address buffer 123 may transmit signals, which correspond to the command, of the sampled address to the command decoder 130. Based on a decoding result of the command decoder 130, the address buffer 123 may transmit the row address RA to the row decoder 152, the column address CA to the column decoder 153, or the operation codes OPCODE to the mode register 140.

The first DQ buffer 124 may include a first receiver 124_1 for receiving the first DQ signal DQ1 and a first transmitter 124_2 for transmitting the first DQ signal DQ1. The first receiver 124_1 may sample the first DQ signal DQ1 including bits of write data or the first operation codes OPCODE1 at a rising edge or a falling edge of the data strobe signal DQS and may transmit the sampled bits or operation codes to the first deserializer 161. The first transmitter 124_2 may receive the first DQ signal DQ1 synchronized with the data strobe signal DQS from the first serializer 162.

The second DQ buffer 125 may include a second receiver 125_1 for receiving the second DQ signal DQ2 and a second transmitter 125_2 for transmitting the second DQ signal DQ2. The second DQ buffer 125 may operate similar to the first DQ buffer 124. For example, the second receiver 125_1 may sample the second DQ signal DQ2 including bits of write data or the second operation codes OPCODE2 at a rising edge or a falling edge of the data strobe signal DQS and may transmit the sampled bits or operation codes to the second deserializer 171. The second transmitter 125_2 may receive the second DQ signal DQ2 synchronized with the data strobe signal DQS from the second serializer 172. In an exemplary embodiment of the inventive concept, the memory device 100 may further include DQ buffers, the number of which is the same as the number of DQ pins.

The command decoder 130 may receive and decode the sampled command from the command buffer 122 and a signal corresponding to the command from the address buffer 123. For example, the command decoder 130 may decode an activation command, a write command, a read command, a precharge command, a mode register set (MRS) command, etc. and may control components of the memory device 100. Here, the MRS command may include a mode register update command (hereinafter referred to as an "MRU command"), a mode register write command (hereinafter referred to as an "MRW command"), a mode register read command (hereinafter referred to as an "MRR command"), etc.

The command decoder 130 may transmit a row control signal R_CTRL to the row decoder 152 in response to the activation command, the precharge command, etc. The command decoder 130 may transmit a column control signal C_CTRL to the column decoder 153 in response to the write command, the read command, etc. The command decoder 130 may transmit a first MRU1 signal or a first MRW1 signal to the mode register 140 in response to the MRU command or the MRW command for the mode register 140. The command decoder 130 may transmit a second MRU2 signal or a second MRW2 signal to the first and second mode registers 164 and 174 in response to the MRU command or the MRW command for the first and second mode registers 164 and 174.

The mode register 140 may store setting values for various modes of operation, which the memory device 100 supports, based on the first MRU1 signal or the first MRW1 signal. Here, the setting values stored in the mode register 140 may be associated with the whole memory device 100, not the first and second DQ signals DQ1 and DQ2. The memory device 100 may further include one or more mode registers in addition to the mode register 140. The memory controller 11 may set various modes of operation of the memory device 100 by using the setting values stored in the mode register 140.

For example, the setting of various operation modes may include operations of setting a burst length, setting a read burst type, setting a column address strobe (CAS) latency, setting a delay locked loop (DLL) enable or reset, setting a write recovery (WR) and read to precharge (RTP), setting an additive latency (AL), setting RTT_NOM, RTT_WR, and RTT_PARK, setting impedance control of an output driver, setting write leveling, setting TDQS enable, setting write cyclical redundancy checks (CRC), setting a refresh operation, setting a CAS write latency (CWL), setting a multipurpose register (MPR), setting a temperature sensor, setting a geardown mode, setting a write and read preamble, setting a reference voltage (Vref), setting power-down, setting a data bus inversion (DBI), setting a data mask, setting an on die termination (ODT), setting parity, setting ZQ calibration, and the like.

The memory cell array 151 may include a plurality of memory cells. The memory cell array 151 may be a bank. The number of banks may be determined in compliance with various protocols of the memory device 100. Memory cells may be disposed at intersections of word lines and bit lines of the bank. For example, the memory cells may include a DRAM cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, or a magnetic random access memory (MRAM) cell.

The row decoder 152 may receive the row control signal R_CTRL from the command decoder 130 and the row address RA from the address buffer 123 and may select a word line WL. The row decoder 152 may be disposed along a direction in which word lines WLs are disposed, and may drive the word lines WLs of the memory cell array 151.

The column decoder 153 may receive the column control signal C_CTRL from the command decoder 130 and the column address CA from the address buffer 123 and may select a column selection line CSL. Since one or more bit lines are connected to the column selection line CSL, the bit lines connected to the column selection line CSL may be selected by the column decoder 153. For example, the column decoder 153 may be disposed along a direction in which column selection lines CSLs are disposed, and may drive the column selection lines CSLs of the memory cell array 151. The word lines WLs and the column selection lines CSLs of the memory cell array 151 may intersect to be perpendicular to each other.

The data buffer 154 may receive write data from the first and second deserializers 161 and 171 and may transmit the write data to the memory cell array 151 through global input/output lines GIO. The data buffer 154 may receive read data from the memory cell array 151. To accomplish this, the data buffer 154 may sense and amplify voltages of the global input/output lines GIO. The data buffer 154 may transmit the read data to the first and second serializers 162 and 172. Here, the number of bits included in each of the write data and the read data may be determined depending on the number of prefetch bits of the memory device 100.

The first deserializer 161 may receive and deserialize bits of write data from the first receiver 124_1. The first deserializer 161 may receive and deserialize the first operation codes OPCODE1 from the first receiver 124_1. For example, the first deserializer 161 may receive and deserialize (or align) data from the first receiver 124_1 regardless of the command decoded by the command decoder 130.

The first serializer 162 may receive and serialize bits of read data from the data buffer 154. The first serializer 162 may transmit the serialized bits to the first transmitter 124_2. In an exemplary embodiment of the inventive concept, the first serializer 162 may receive and serialize the setting values stored in the mode register 140 or the first mode register 164, in addition to data stored in the memory cell array 151.

The first demultiplexer 163 may receive the deserialized bits or the deserialized operation codes from the first deserializer 161. In response to the command decoded by the command decoder 130, the first demultiplexer 163 may transmit the deserialized result of the first deserializer 161 to the first mode register 164 or to the data buffer 154. For example, the first demultiplexer 163 may transmit the deserialized operation codes (OPCODE1) to the first mode register 164 in response to the MRU command for the first and second mode registers 164 and 174. The first demultiplexer 163 may transmit the deserialized bits to the data buffer 154 in response to a write command. The deserialized bits may be stored in the memory cell array 151 through the data buffer 154.

The first mode register 164 may store the first operation codes OPCODE1 transmitted from the first demultiplexer 163. For example, the first mode register 164 may be disposed in the vicinity of the first DQ pin 114 or circuits (e.g., the first DQ buffer 124) for driving the first DQ pin 114 or may be disposed adjacent to the first DQ pin 114.

The first mode register 164 may store the first operation codes OPCODE1 input through the first DQ pin 114 based on the second MRU2 signal or the second MRW2 signal. In an exemplary embodiment of the inventive concept, the first mode register 164 may store the first operation codes OPCODE1 input through the address pin 113 based on the first MRU1 signal or the first MRW1 signal in addition to the second MRU2 signal or the second MRW2 signal. The first operation codes OPCODE1 may be stored in the first mode register 164 by using the way to transmit the first operation codes OPCODE1 to the address pin 113 or the way to transmit the first operation codes OPCODE1 to the first DQ pin 114.

The first mode register 164 may store setting values corresponding to the first operation codes OPCODE1 and may generate a first set signal SET1 by using the setting values. An example is illustrated in FIG. 2 as the first set signal SET1 is transmitted to the first DFE 165, but the inventive concept is not limited thereto. For example, to support a high-speed interface, the memory device 100 may include various circuits for improving transmission characteristics of the first DQ signal DQ1, such as signal reflection, signal integrity, inter symbol interference (ISI), rank margin test (RMT), etc., and the first set signal SET1 may be used for such circuits. The memory device 100 may further include a TX equalizer (a transmit equalizer).

The first DFE 165 that is a non-linear equalizer may cancel or reduce the ISI of a signal currently sampled by the first receiver 124_1 by using a signal previously sampled by the first receiver 124_1. The first DFE 165 may improve distortion of the first DQ signal DQ1 upon receiving the first DQ signal DQ1. In other words, the first DFE 165 may reduce distortion of the first DQ signal DQ1.

In an exemplary embodiment of the inventive concept, the first DFE 165 may generate a reference signal by using tap values and a bias included in the first set signal SET1, and the first receiver 124_1 may compare the first DQ signal DQ1 with the reference signal at the rising edge or the falling edge of the data strobe signal DQS. The reference signal may be a reference voltage generated based on the first operation codes OPCODE1. As the number of tap values that the first DFE 165 supports increases, the reference voltage may be generated more precisely.

The second deserializer 171, the second serializer 172, the second demultiplexer 173, the second mode register 174, and the second DFE 175 may operate similar to the first deserializer 161, the first serializer 162, the first demultiplexer 163, the first mode register 164, and the first DFE 165. However, the second deserializer 171, the second serializer 172, the second demultiplexer 173, the second mode register 174, and the second DFE 175 may be circuits associated with the second DQ signal DQ2 and the second operation codes OPCODE2. For example, the second deserializer 171 may receive and deserialize bits of write data from the second receiver 125_1. The second deserializer 171 may receive and deserialize the second operation codes OPCODE2 from the second receiver 125_1.

Figure 3:
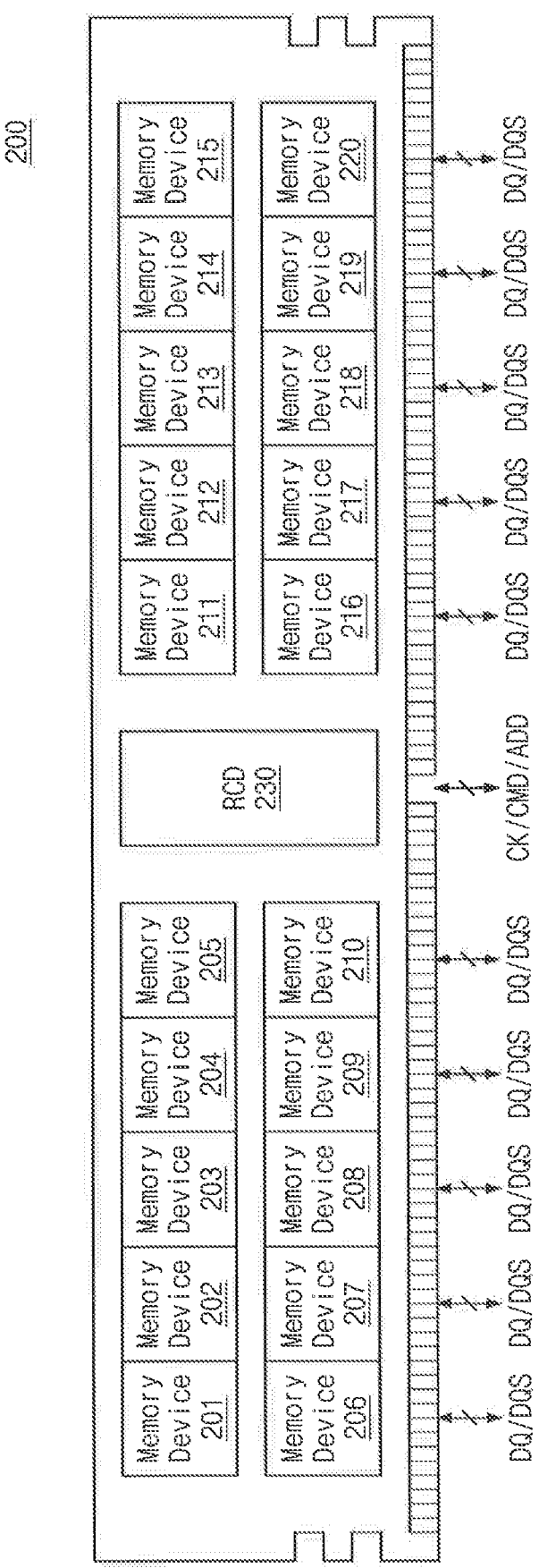
FIG. 3 is a view illustrating a memory module according to an exemplary embodiment of the inventive concept.

FIG. 3 is a view illustrating a memory module according to an exemplary embodiment of the inventive concept. A memory module 200 of FIG. 3 is another example of the memory module 12 of FIG. 1. Referring to FIG. 3, the memory module 200 may include memory devices 201, 202, 203, 204, 205, 206, 207, 208, 209, 210, 211, 212, 213, 214, 215, 216, 217, 218, 219 and 220 and a register clock driver (RCD) 230. The memory devices 201 to 220 may be separated and disposed on the right and left sides with respect to the register clock driver 230.

The memory module 200 may be a dual in-line memory module (DIMM) that complies with the Joint Electron Device Engineering Council (JEDEC) standard. For example, the memory module 200 may be a registered DIMM (RDIMM), a load reduced DIMM (LRDIMM), an unbuffered DIMM (UDIMM), a fully buffered DIMM (FB-DIMM), a small outline DIMM (SO-DIMM), or any other memory module (e.g., a single in-line memory module (SIMM)).

Each of the memory devices 201 to 220 may be the memory device 100 of FIG. 2. The memory devices 201 to 220 may be various DRAM devices such as a double data rate synchronous dynamic random access memory (DDR SDRAM), DDR2 SDRAM, DDR3 SDRAM, DDR4 SDRAM, DDR5 SDRAM, a low power double data rate (LPDDR) SDRAM, LPDDR2 SDRAM, LPDDR3 SDRAM, LPDDR4 SDRAM, LPDDR4X SDRAM, LPDDR5 SDRAM, a graphics double data rate synchronous graphics random access memory (GDDR SGRAM), GDDR2 SGRAM, GDDR3 SGRAM, GDDR4 SGRAM, GDDR5 SGRAM, GDDR6 SGRAM, etc. The memory devices 201 to 220 may be a memory device, in which DRAM dies are stacked, such as a high bandwidth memory (HBM), HBM2, HBM3, etc. The memory devices 201 to 220 may be an SRAM device, a NAND flash memory device, a NOR flash memory device, a RRAM device, a FRAM device, a PRAM device, a TRAM device, an MRAM device, etc. Types of the memory devices 201 to 220 may be the same as each other or may be different from each other.

The types of the memory devices 201 to 220 may not be limited to the above-described types. For example, any device capable of storing data may be included in the memory module 200. The number of the memory devices 201 to 220 illustrated in FIG. 3 is only an example. For example, the number of the memory devices may be determined depending on a memory capacity to be provided to a user and a capacity of each of the memory devices.

The register clock driver 230 may receive a clock CK, a command CMD, and an address ADD from an external device (e.g., a host, a memory controller, etc.). The register clock driver 230 may control the memory devices 201 to 220 based on the clock CK, the command CMD, and the address ADD. The register clock driver 230 may function as a buffer for the clock CK, the command CMD, and the address ADD.

The memory devices 201 to 220 and the register clock driver 230 may configure a rank that can be simultaneously accessed by the memory controller, e.g., the memory controller 11 of FIG. 1. The memory devices 201 to 220 in one rank may share control signals such as a clock, a command, an address, etc.

In an exemplary embodiment of the inventive concept, the memory devices 201 to 220 and the register clock driver 230 may be disposed on one surface (or side) of the memory module 200. The one surface of the memory module 200 may be a surface of a printed circuit board (PCB). Only one surface of the memory module 200 is illustrated in FIG. 3, but the memory module 200 may further include memory devices and a register clock driver disposed on an opposite surface. The memory devices and the register clock driver disposed on the opposite surface may constitute another rank. For example, the memory module 200 may provide at least two ranks by using memory devices disposed on both of its surfaces.

Figure 4:
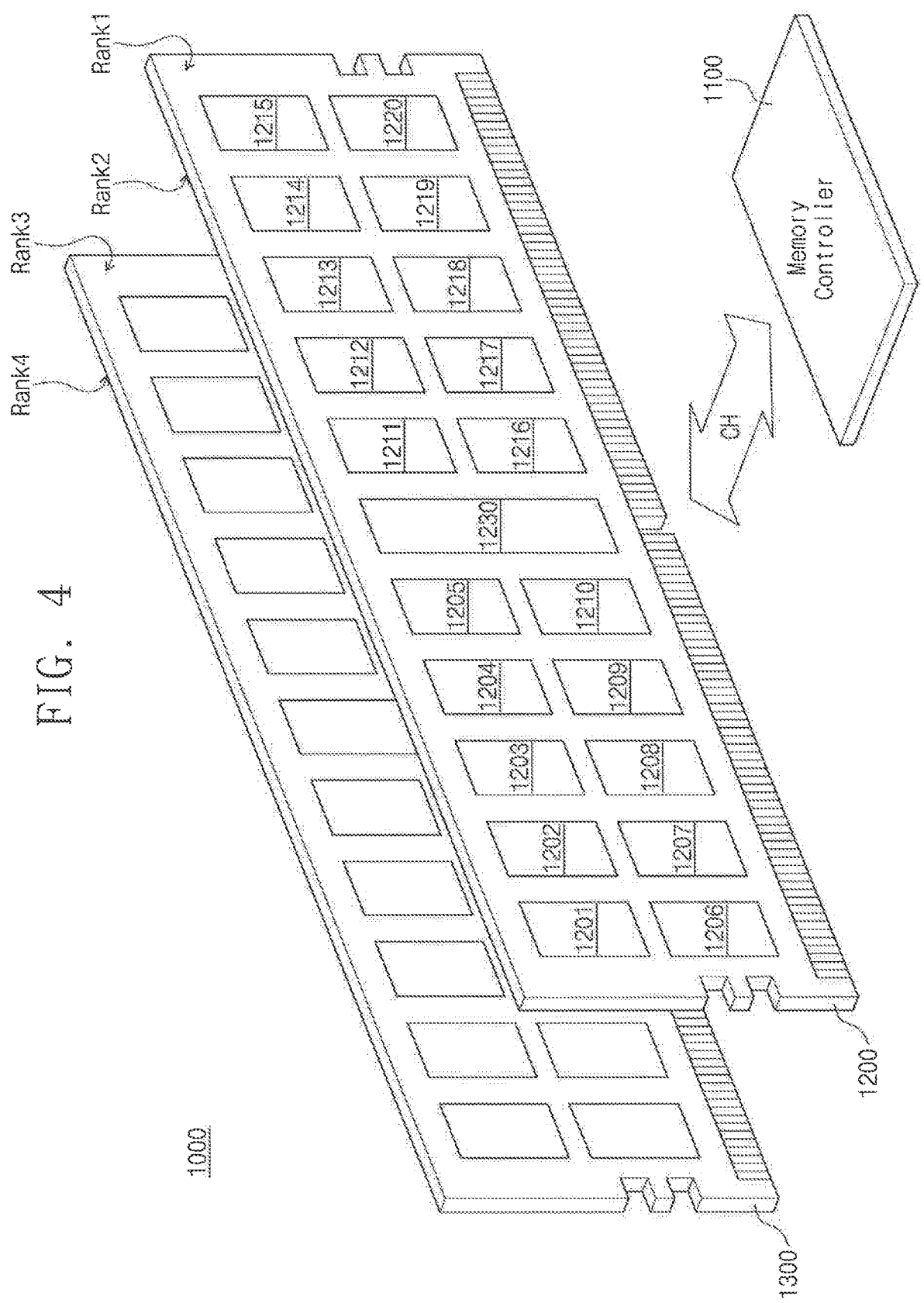
FIG. 4 is a view illustrating a memory system including a memory module of FIG. 3, according to an exemplary embodiment of the inventive concept.

FIG. 4 is a view illustrating a memory system including a memory module of FIG. 3, according to an exemplary embodiment of the inventive concept. Referring to FIG. 4, a memory system 1000 may include a memory controller 1100 and two memory modules 1200 and 1300 (e.g., 2DPC (DIMM per channel)) connected to one channel. A substrate on which the memory controller 1100 and the memory modules 1200 and 1300 are disposed and sockets into which the memory modules 1200 and 1300 are inserted are not illustrated in FIG. 4, for convenience of illustration. The number of DIMMs per channel is not limited to illustration of FIG. 4.

The memory controller 1100 may be the memory controller 11 of FIG. 1. The memory controller 1100 may control the memory modules 1200 and 1300 through a channel CH. Before performing data input/output with the memory modules 1200 and 1300, the memory controller 1100 may set modes of operation, operating environments, functions, etc. of memory devices disposed in the memory modules 1200 and 1300. These modes may be set in advance by the memory controller 1100, for example.

The memory controller 1100 may transmit a mode register set (MRS) command to memory devices through the channel CH. Referring to FIG. 4, for example, since one rank includes 20 memory devices (e.g., 1201 to 1220) and the memory modules 1200 and 1300 include four ranks, the number of memory devices may be 80. The memory controller 1100 may set mode registers of the 80 memory devices at the same time or independently.

Each of the memory modules 1200 and 1300 may be substantially similar to the memory module 200 of FIG. 3. For example, each of the memory modules 1200 and 1300 may provide two ranks to the memory controller 1100 by using memory devices disposed on both surfaces thereof. Memory devices 1201, 1202, 1203, 1204, 1205, 1206, 1207, 1208, 1209, 1210, 1211, 1212, 1213, 1214, 1215, 1216, 1217, 1218, 1219 and 1220 and a register clock driver 1230 of the memory module 1200 may configure a first rank. Second to fourth ranks may be implemented similar to the first rank. All the memory modules 1200 and 1300, for example, four ranks, may be provided to the memory controller 1100.

In an exemplary embodiment of the inventive concept, clock pins, command pins, and address pins of the memory devices 1201 to 1220 of the first rank may be connected to each other or may be shared. Accordingly, the memory controller 1100 may transmit a clock, an MRS command, and an operation code to the clock pins, the command pin, and the address pin shared in a rank, and thus, simultaneously set mode registers (refer to the mode register 140 of FIG. 2) of the memory devices 1201 to 1220.

In an exemplary embodiment of the inventive concept, each memory device may support a Per DRAM Addressability (PDA) mode so that the memory controller 1100 sets mode registers (refer to the mode register 140 of FIG. 2) of one memory device of the memory devices. A memory device may determine whether MRS setting signals transmitted to one's own clock, command, and address pins are valid, with reference to a signal transmitted to one's own DQ pin. The memory controller 1100 may select one of memory devices by transmitting a signal to a DQ pin of a memory device to be set. The PDA mode will be more fully described with reference to FIG. 5.

In an exemplary embodiment of the inventive concept, as a speed at which the memory modules 1200 and 1300 operate increases, the memory controller 1100 may independently set environments in which DQ signals of all memory devices of the memory modules 1200 and 1300 are transmitted. Since locations of DQ pins of a memory device are different from each other and locations of memory devices of the memory modules 1200 and 1300 are different from each other, environments where DQ signals are transmitted may be different from each other.

For example, the memory controller 1100 may independently set receivers and transmitters (e.g., refer to the first and second receivers 124_1 and 125_1 and the first and second transmitters 124_2 and 125_2 of FIG. 2) of memory devices. The memory controller 1100 may independently set mode registers (refer to the first and second mode registers 164 and 174 of FIG. 2) of the memory devices for DQ signals.

Figure 5:
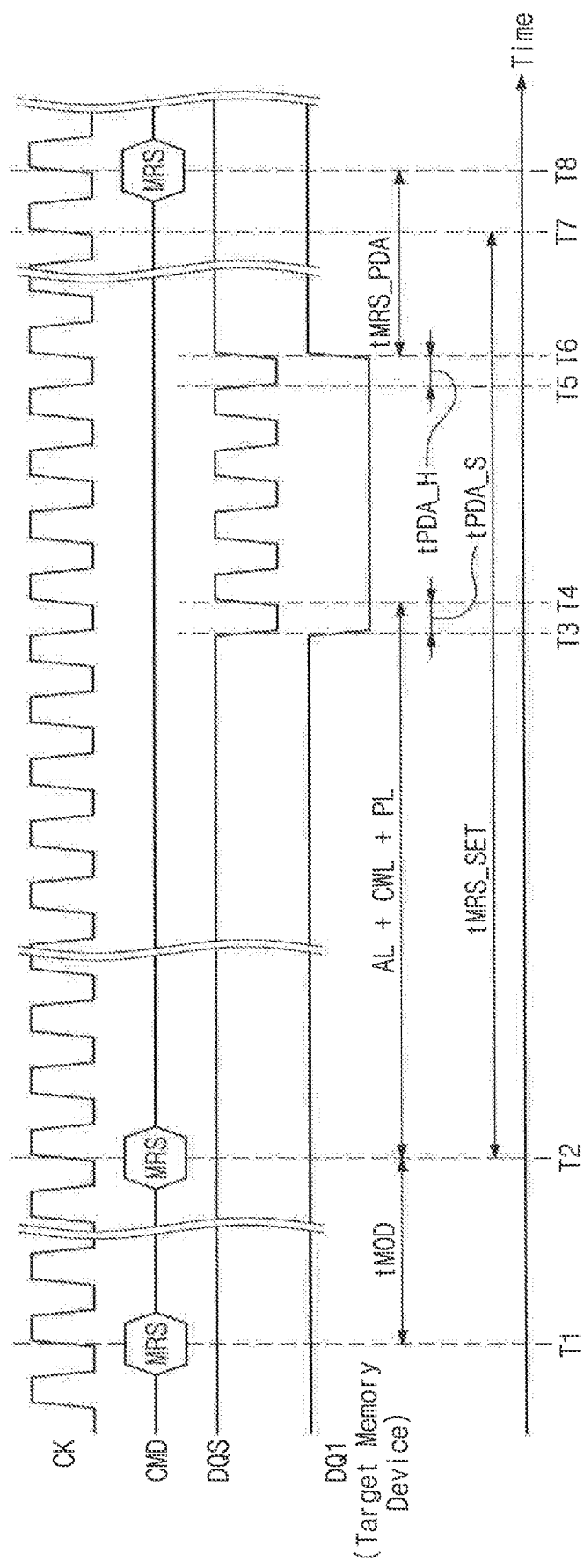
FIG. 5 is a timing diagram illustrating a method of setting mode registers of a memory device, according to an exemplary embodiment of the inventive concept.

FIG. 5 is a timing diagram illustrating a method of setting mode registers of a memory device, according to an exemplary embodiment of the inventive concept. FIG. 5 will be described with reference to FIGS. 1 to 4. The memory controller 1100 may simultaneously set memory devices of the memory modules 1200 and 1300 or may independently set the memory devices of the memory modules 1200 and 1300 by using the PDA mode of the above-described memory device. In FIG. 5, it is assumed that the memory controller 1100 does not transmit operation codes to DQ pins of the memory devices.

At a time point T1, the memory controller 1100 may transmit an MRS command to the memory devices 1201 to 1220 of a first rank. The memory devices 1201 to 1220 may share a command and address transmission path. Mode registers of each of the memory devices 1201 to 1220 may be simultaneously set by the MRS command transmitted at the time point T1. Operation codes transmitted to address pins (refer to the address pin 113 of FIG. 2) together with the MRS command may be stored in the mode registers of each of the memory devices 1201 to 1220. Here, the mode registers set by the MRS command transmitted at the time point T1 may include the mode register 140, the first mode register 164, or the second mode register 174 of FIG. 2.

At a time point T2, the memory controller 1100 may transmit an MRS command to the memory devices 1201 to 1220 of the first rank. The MRS command of the time point T2 is different from the MRS command of the time point T1. The MRS command of the time point T1 may set the mode registers of all the memory devices 1201 to 1220, and the MRS command of the time point T2 may set only mode registers of a target memory device of the memory devices 1201 to 1220. The memory controller 1100 may transmit the MRS command at the time point T1 and may again transmit the MRS command after tMOD. tMOD is a time interval between the MRS commands and may be determined in advance.

The memory controller 1100 may transmit a signal corresponding to logic "0" to a first DQ1 pin (refer to the first DQ1 pin 114 of FIG. 2) of the target memory device of the memory devices 1201 to 1220 from a time point T3 to a time point T6. The target memory device may store the operation codes input at the time point T2 in internal mode registers, based on the signal corresponding to logic "0" and transmitted to the first DQ1 pin. The memory controller 1100 may transmit the signal corresponding to logic "1" to first DQ1 pins of the rest of the memory devices other than the target memory device. Each of the memory devices other than the target memory device may ignore the operation codes input at the time point T2, based on the signal corresponding to logic "1".

Each of the memory devices entering the PDA mode may determine whether the MRS command that the memory controller 1100 transmits is valid, based on a logical state of the signal input to the first DQ1 pin. Since the signal input to the first DQ1 pin of the target memory device corresponds to logic "0", the target memory device may store the operation codes transmitted to an address pin together with the MRS command in the mode registers in response to the MRS command. Since the signal input to the first DQ1 pin of each of the memory devices other than the target memory device corresponds to logic "1", the rest of the memory devices may not respond to the MRS command.

Referring to FIG. 5, the memory controller 1100 may transmit the signal corresponding to logic "0" to the first DQ1 pin of the target memory device and may further transmit a data strobe signal to a DQS pin of the target memory device so that the target memory device may sample the logic "0" signal transmitted to the first DQ1 pin. The data strobe signal may toggle from the time point T3 to the time point T6. In an exemplary embodiment of the inventive concept, the memory controller 1100 may transmit the signal corresponding to logic "0" to any one of the DQ pins other than the first DQ1 pin.

An interval from the time point T2 to the time point T4 may correspond to a write latency, in other words, a sum of an additive latency (AL), a CAS write latency (CWL), and a parity latency (PL). The interval from the time point T3 to the time point T4 may correspond to a setup time tPDA_S, and an interval from the time point T5 to the time point T6 may correspond to a hold time tPDA_H. An interval from the time point T6 to a time point T8 may correspond to tMRD_PDA, and tMRD_PDA may be a time interval between the last rising edge of the data strobe signal and a next MRS command. An interval from the time point T2 to the time point T7 may correspond to tMRS_SET, and tMRS_SET may be a time taken to set mode registers of a memory device.

The memory controller 1100 may set a DFE of (refer to the first and second DFEs 165 and 175 of FIG. 2) of the target memory device. For example, the memory controller 1100 may issue the MRS command four times to set tap values of the DFE and may issue the MRS command once to set a bias of the DFE. Setting values for the tap values and the bias of the DFE may be stored in mode registers (refer to the first and second mode registers 164 and 174 of FIG. 2) for DQ signals of the target memory device. The memory controller 1100 may issue the MRS command a total of five times to set the DFE of the target memory device and a time corresponding to "5×tMRS_SET" may be used to set the DFE with respect to one DQ signal of the target memory device. Here, the number of times that the MRS command is issued is merely exemplary.

The memory controller 1100 may repeat the operation between the time point T2 and the time point T8 to set the DFE for each DQ signal of all memory devices of the memory modules 1200 and 1300. A time taken for the memory controller 1100 to set the DFE for each DQ signal of all memory devices of the memory modules 1200 and 1300 may be calculated by (MRS setting time)×(the number of times that the MRS command is issued)×(the number of DQ signals per memory device)×(the number of memory devices per rank)×(the number of ranks per DIMM)×(the number of DIMMs per channel).

For example, each of the memory modules 1200 and 1300 may provide two ranks, one rank may include 20 memory devices 1201 to 1220, one memory device may operate at a ×4 mode (four DQ signals), and tMRS_SET may be about 30 ns. In this case, a time taken to set the DFE may be 48 us (=30 ns×5MRS×4DQ×20PKG×2RANK×2DPC). Here, "PKG" stands for package and may indicate a memory device.

An example was just given in which the memory controller 1100 sets the DFE for a DQ signal of a memory device. However, the memory controller 1100 may set other functions of the memory device in a similar manner.

Figure 6:
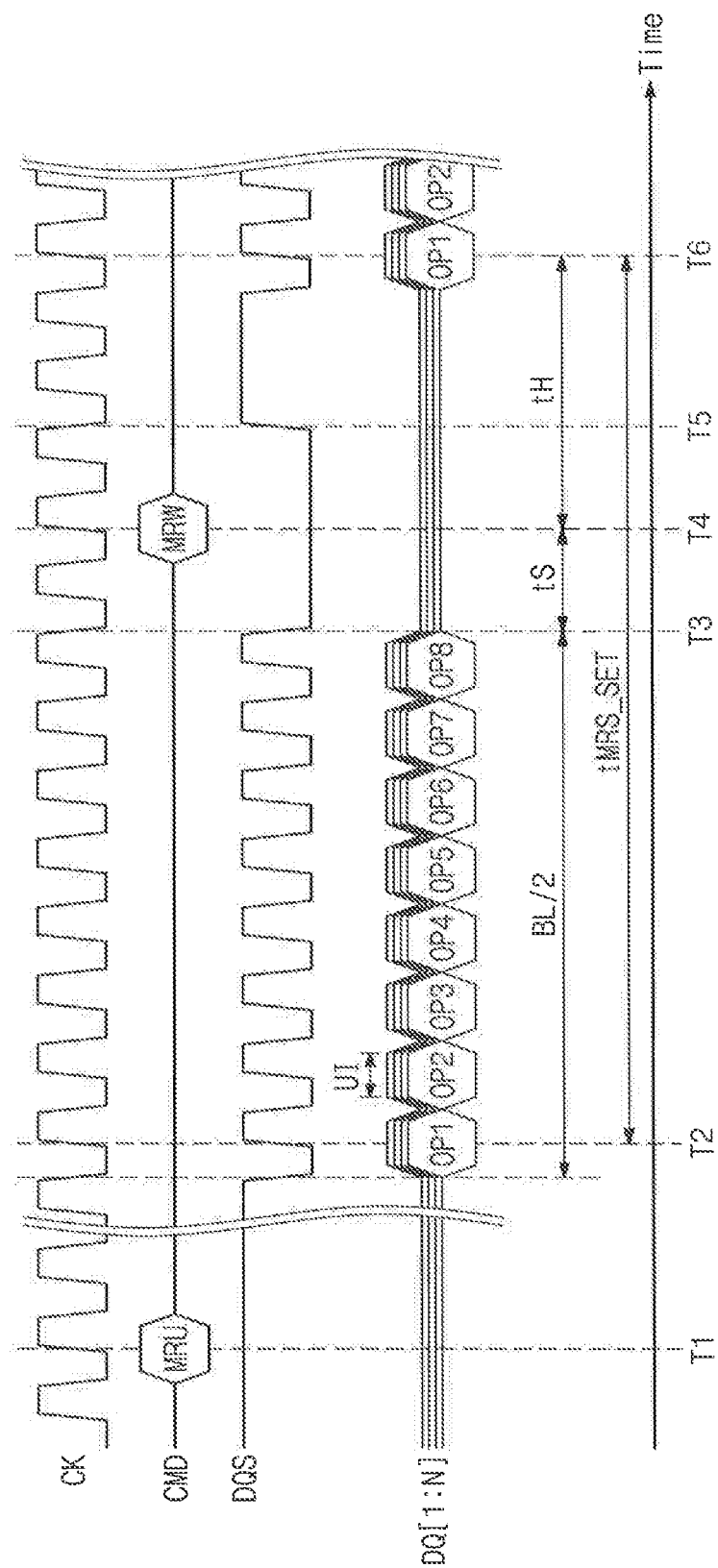
FIGS. 6, 7 and 8 are timing diagrams illustrating methods of setting mode registers of a memory device, according to an exemplary embodiment of the inventive concept.
Figure 7:
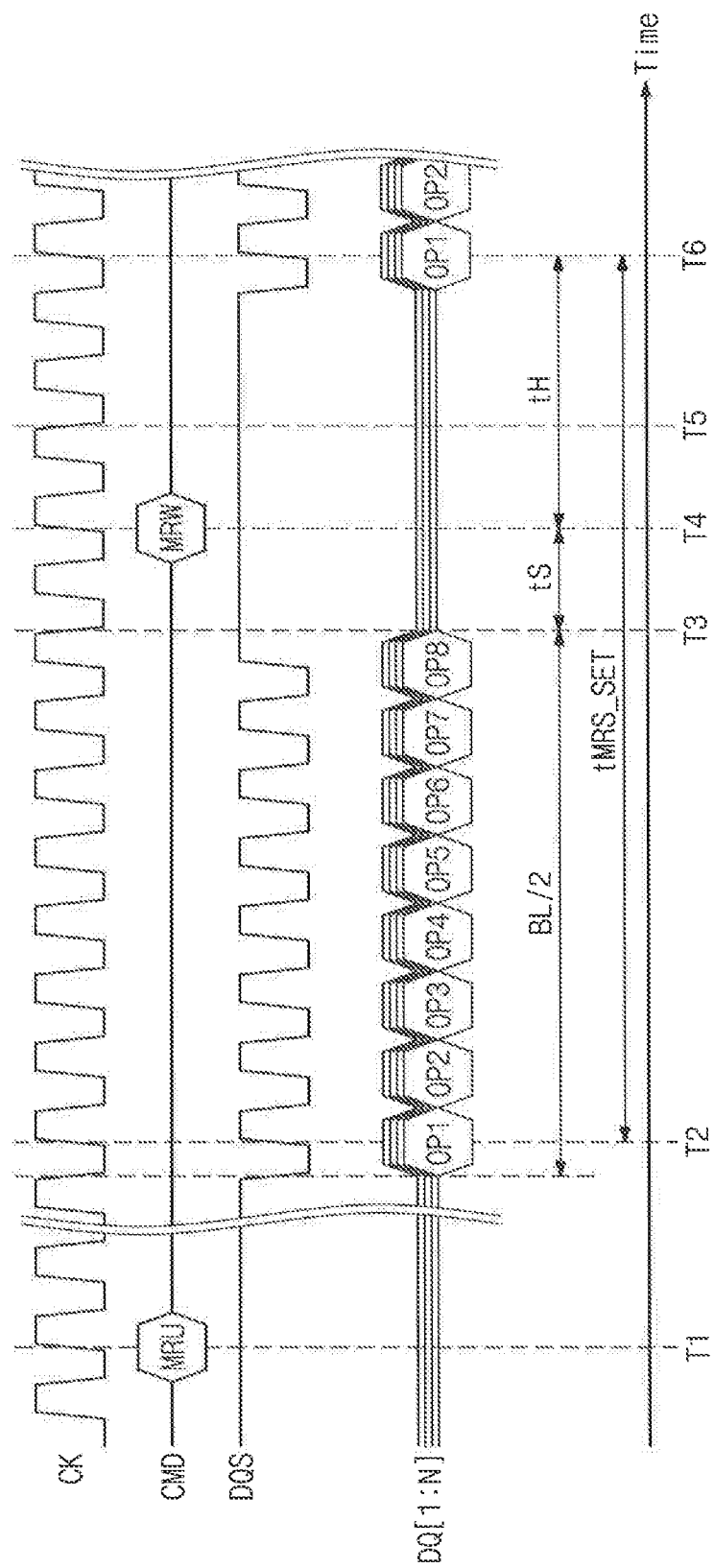
Figure 8:
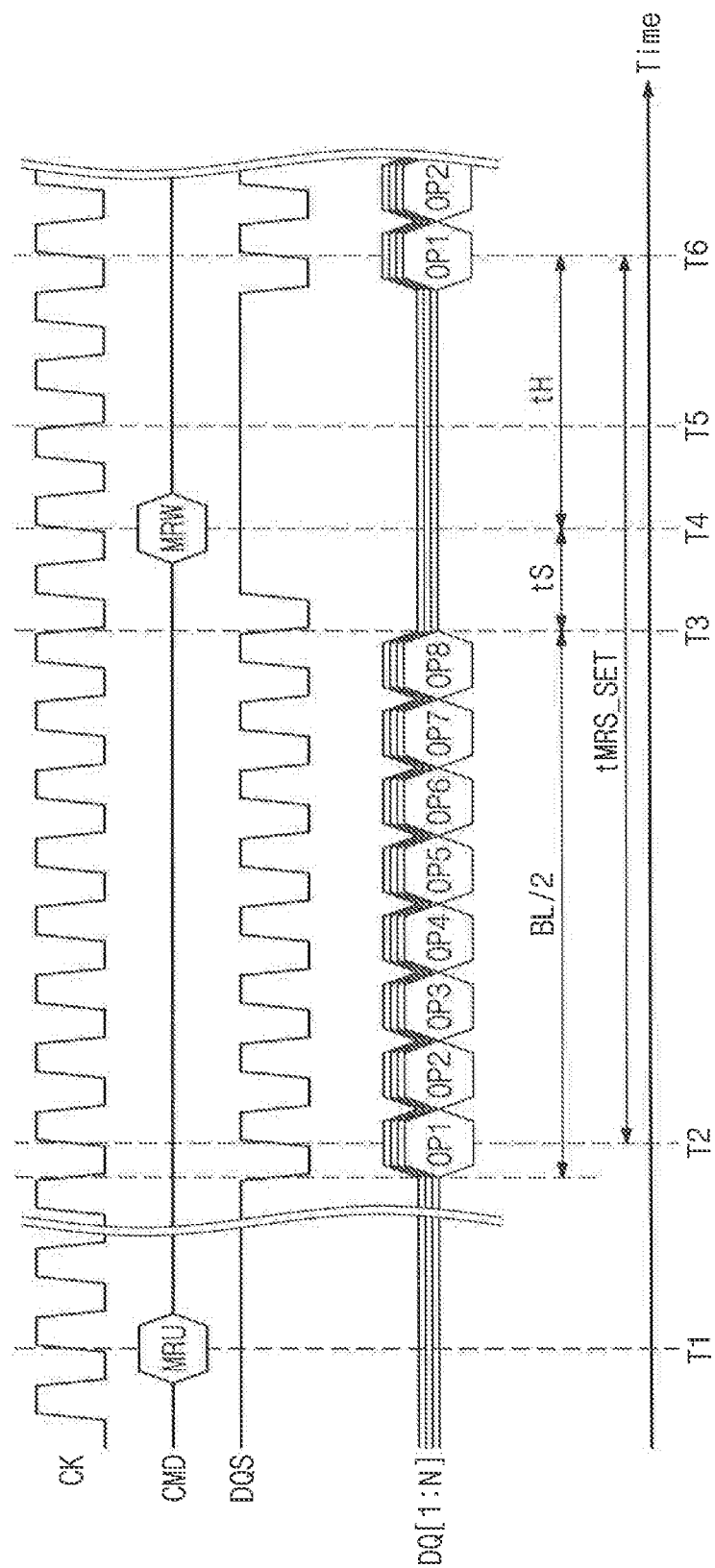

FIGS. 6, 7 and 8 are timing diagrams illustrating methods of setting mode registers of a memory device, according to an exemplary embodiment of the inventive concept. FIGS. 6 to 8 will be described with reference to FIGS. 2, 4, and 5.

Referring to FIGS. 6 to 8, at a time point T1, the memory controller 1100 may transmit the MRU command for the memory devices 1201 to 1220 of the first rank to a memory device. For example, the MRU command may be a command assigned to a multi-purpose command (MPC). The memory devices 1201 to 1220 may decode the command and may prepare to receive operation codes input from a time point T2.

At the time point T2, the memory controller 1100 may transmit the operation codes to DQ pins. Here, the DQ pins may be all DQ pins of the memory devices 1201 to 1220. The DQ pins may respectively receive DQ signals DQ[1:N]. Here, "N" may be a natural number and may indicate the number of all DQ pins of the memory devices 1201 to 1220.

For example, the memory controller 1100 may transmit a total of (8×N) operation codes during a time corresponding to "BL/2". The time corresponding to "BL/2" may start before the second time point T2, for example, at a falling edge of the data strobe signal (DQS) prior to the start of the second time point T2. "BL" may indicate a burst length. In FIG. 6, "BL" is 16. However, the inventive concept is not limited thereto. Each of the DQ signals DQ[1:N] may include 8 operation codes OP1 to OP8. The 8 operation codes OP1 to OP8 for one DQ signal may be referred to as a "sub operation code group".

A unit interval UI of the 8 operation codes OP1 to OP8 may be, for example, one period of a clock (CK). The memory controller 1100 may transmit a data strobe signal (DQS) to the DQ pins so that the memory devices may sample signals (e.g., operation codes) transmitted to the DQ pins.

At a time point T4, the memory controller 1100 may transmit an MRW command to the memory devices 1201 to 1220. Each of the memory devices 1201 to 1220 may store operation codes deserialized or aligned by deserializers (refer to the first and second deserializers 161 and 171 of FIG. 2) in response to the MRW command. In an exemplary embodiment of the inventive concept, each of the memory devices 1201 to 1220 may store operation codes deserialized or aligned by the deserializers (the first and second deserializers 161 and 171 of FIG. 2) in response to the MRU command without the MRW command.

Here, an interval from a time point T3 to the time point T4 may correspond to a setup time tS, and an interval from the time point T4 to a time point T6 may correspond to a hold time tH. "tS" and "tH" that are "n×tCK" (n being a natural number and tCK being a period of a clock) may be an integer multiple of the clock's (CK) period or an absolute delay time regardless of the clock (CK). The time corresponding to "BL/2" may end at the third time point T3. In addition, the setup time tS may end at the time point T4 and the hold time tH may start at the time point T4.

Referring to FIG. 6, to store operation codes OP1 to OP8, the memory controller 1100 may maintain the data strobe signal (DQS) in a first logical state (logic "0") from T3 to T5 and may maintain the data strobe signal (DQS) in a second logical state after T5. The memory devices 1201 to 1220 may store the operation codes OP1 to OP8 based on the first logical state maintained before and after the time point T4 and the MRW command of the time point T4. In other words, the operation codes OP1 to OP8 may be stored when the data strobe signal (DQS) is logic "0" at the time point T4, and when the MRW command is provided at the time point T4.

Referring to FIG. 7, to store operation codes OP1 to OP8, the memory controller 1100 may maintain the data strobe signal (DQS) in a second logical state (logic "1") from T3 to T6 (or before new operation codes are transmitted). The memory devices 1201 to 1220 may store the operation codes OP1 to OP8 based on the second logical state maintained before and after the time point T4 and the MRW command of the time point T4.

Referring to FIG. 8, the memory controller 1100 may transmit the operation codes OP1 to OP8 to the memory devices 1201 to 1220 and, after a time point T3, may maintain the data strobe signal (DQS) in the first logical state during half of a period of the clock (CK) for notifying the memory devices 1201 to 1220 that operation codes OP1 to OP8 are transmitted (e.g., postamble). The memory devices 1201 to 1220 may store the operation codes OP1 to OP8 based on the postamble period and the MRW command of the time point T4.

It is to be understood that the waveforms of the data strobe signal (DQS) illustrated in FIGS. 6 to 8 are merely exemplary. For example, a memory device may store the operation codes OP1 to OP8, based on the command input at the time point T4, regardless of the data strobe signal (DQS) from the time point T3 to the time point T5. In an exemplary embodiment of the inventive concept, the memory controller 1100 may maintain the data strobe signal (DQS) in the first logical state before transmitting the operation codes OP1 to OP8 to the memory devices 1201 to 1220 (e.g., preamble).

At a time point T6, the memory controller 1100 may transmit the operation codes OP1, OP2 . . . to the DQ pins like the operation at the time point T2. The operation codes OP1 to OP8 input from the time point T2 and the operation codes OP1, OP2 . . . input from the time point T6 may be the same as or different from each other and may be stored in the same register or different registers.

Waveforms after the time point T6 may be similar to the waveforms from the time point T2 to the time point T6. A time taken for the memory controller 1100 to transmit the operation codes OP1 to OP8 to the memory devices 1201 to 1220 of the first rank once through the DQ pins may correspond to an interval tMRS_SET from the time point T2 to the time point T6.

Comparing the mode register setting method illustrated in FIG. 5 with the mode register setting methods illustrated in FIGS. 6 to 8, in the example of FIG. 5, the memory controller 1100 may transmit operation codes OP1 to OP8 for setting the respective memory devices 1201 to 1220 or the respective DQ signals to address pins. In the examples of FIGS. 6 to 8, the memory controller 1100 may transmit the operation codes OP1 to OP8 for setting the respective memory devices 1201 to 1220 or the respective DQ signals to DQ pins, not address pins.

The memory devices 1201 to 1220 of the first rank may share command and address transmission paths. Accordingly, in the case where the memory controller 1100 sets all the memory devices 1201 to 1220 to be the same as each other, like the setting method illustrated in FIG. 5, it may be efficient to transmit the same operation codes to address pins of the memory devices 1201 to 1220.

The memory devices 1201 to 1220 of the first rank may not share data input/output paths (transmission paths of DQ signals). Accordingly, in the case where the memory controller 1100 sets the memory devices 1201 to 1220 independently of each other, like the setting methods illustrated in FIGS. 6 to 8, it may be efficient to transmit different operation codes to DQ pins of the memory devices 1201 to 1220 independently. In particular, when the memory controller 1100 sets respective DQ signals of the memory devices 1201 to 1220 independently, it may be more efficient to transmit different operation codes to the DQ pins of the memory devices 1201 to 1220 independently.

In an exemplary embodiment of the inventive concept, the memory controller 1100 may set respective DFEs for DQ signals of all memory devices of the memory modules 1200 and 1300. According to the mode register setting methods illustrated in FIGS. 6 to 8, a time taken for the memory controller 1100 to set the DFEs of all the DQ signals of the memory modules 1200 and 1300 may be calculated as such: (MRS setting time)×(the number of times that the MRS command is issued)×(the number of ranks per DIMM)×(the number of DIMMs per channel).

For example, each of the memory modules 1200 and 1300 may include two ranks, one rank may include 20 memory devices 1201 to 1220, one memory device may operate in a ×4 mode (four DQ signals), and tMRS_SET may be about 30 ns. In this case, a time taken to set the DFE may be 0.6 us (=30 ns×5MRS×2RANK×2DPC). In the example described with reference to FIG. 5, a time taken to set DFEs may be 48 us. In the examples of FIGS. 6 to 8, since the memory controller 1100 simultaneously transmits operation codes OP1 to OP8 to all DQ pins of the 20 memory devices 1201 to 1220 in the same rank, a time taken to set DFEs may decrease. In an exemplary embodiment of the inventive concept, in addition to the DFE setting mode of operation, by the setting methods of FIGS. 6 to 8, a time taken to set another mode of operation for DQ signals of the memory modules 1200 and 1300 may decrease.

Figure 9:
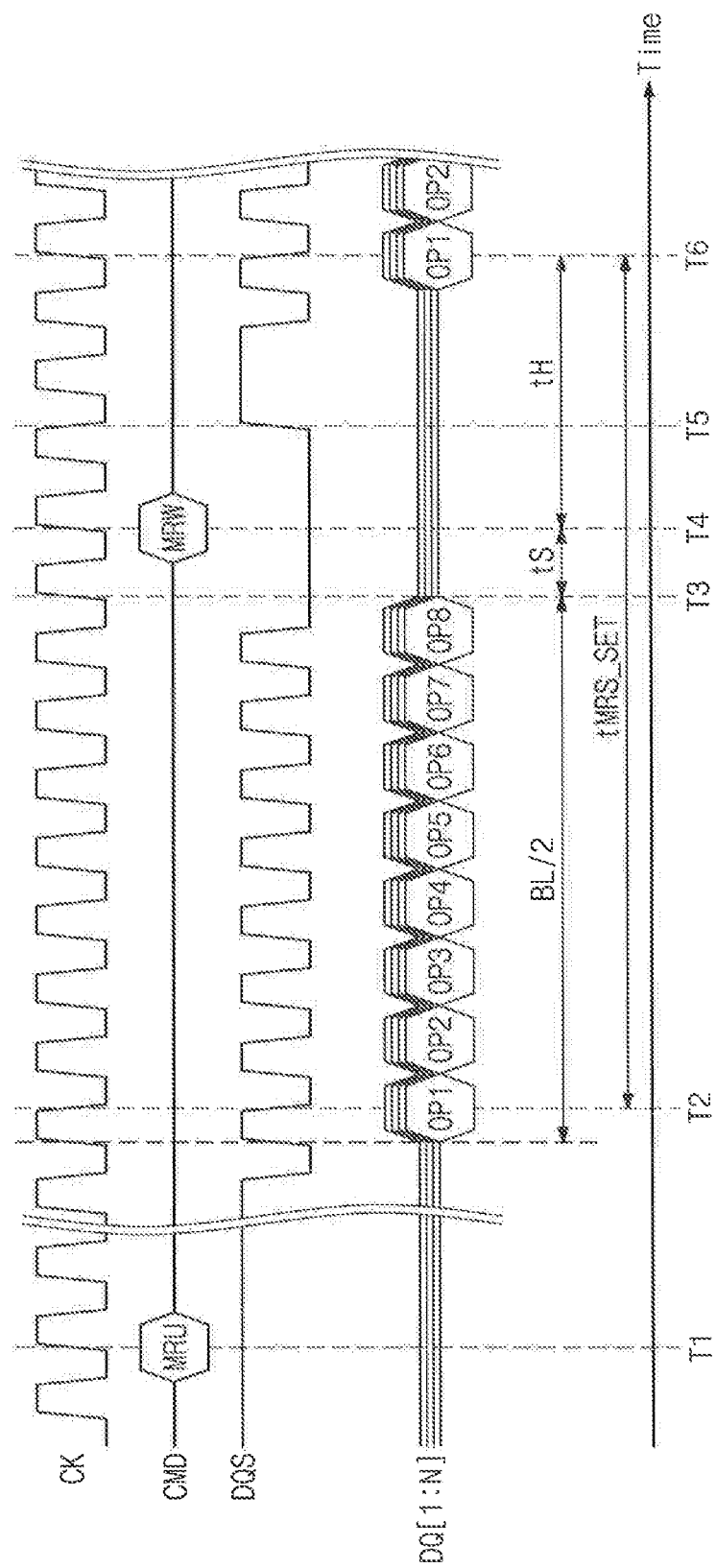
FIG. 9 is a timing diagram illustrating a method of setting mode registers of a memory device, according to an exemplary embodiment of the inventive concept.

FIG. 9 is a timing diagram illustrating a method of setting mode registers of a memory device, according to an exemplary embodiment of the inventive concept. A difference between FIGS. 6 and 9 will be described below.

In the case of FIG. 6, operation codes OP1 to OP8 of the DQ signals DQ[1:N] may be synchronized with rising edges of the data strobe signal (DQS). Referring to FIG. 9, the memory controller 1100 may transmit operation codes OP1 to OP8 synchronized with falling edges of the data strobe signal (DQS) to the memory devices 1201 to 1220.

In an exemplary embodiment of the inventive concept, like in FIG. 6, the memory controller 1100 may maintain the data strobe signal (DQS) in the first logical state from the time point T3 to the time point T5. In an exemplary embodiment of the inventive concept, the memory controller 1100 may maintain the data strobe signal (DQS) at the first logical state before transmitting the operation codes OP1 to OP8 (e.g., preamble) or may maintain the data strobe signal (DQS) at the first logical state after transmitting the operation codes OP1 to OP8 (e.g., postamble).

In an exemplary embodiment of the inventive concept, the memory controller 1100 may transmit operation codes OP1 to OP8 synchronized with both rising edges and falling edges of the data strobe signal (DQS) to the memory devices 1201 to 1220. In this case, the operation codes OP1 to OP8 may be transmitted to the memory devices 1201 to 1220 at two times a clock frequency, in other words, at a double data rate (DDR), and the UI of the operation codes OP1 to OP8 may be half the period of a clock (CK). A speed at which operation codes OP1 to OP8 illustrated in FIGS. 6 to 9 are transmitted may correspond to a clock frequency, in other words, a single data rate (SDR).

Figure 10:
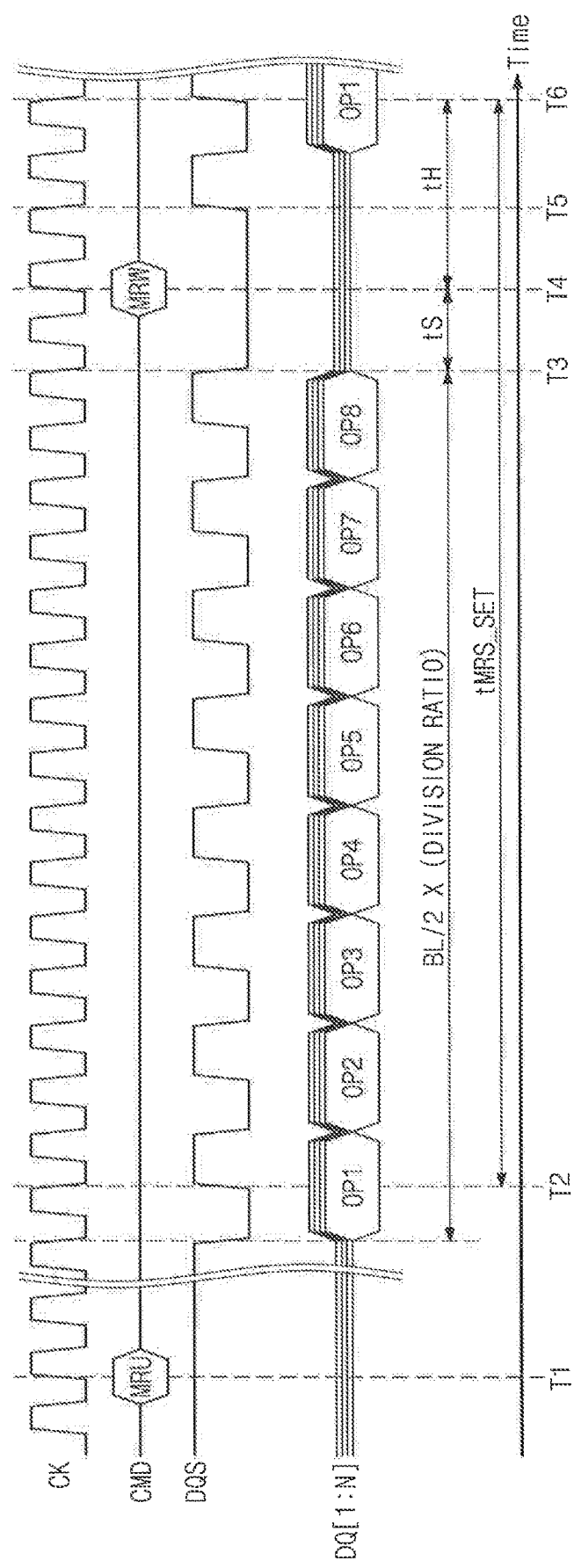
FIG. 10 is a timing diagram illustrating a method of setting mode registers of a memory device, according to an exemplary embodiment of the inventive concept.

FIG. 10 is a timing diagram illustrating a method of setting mode registers of a memory device, according to an exemplary embodiment of the inventive concept. FIG. 10 will be described with respect to a difference between FIG. 6 to FIG. 9.

To secure a setup and hold margin tS/H of the DQ signals DQ[1:N], the memory controller 1100 may transmit an M-divided data strobe signal (DQS) to memory devices. Here, "M" is a natural number of 2 or more. In the case where "M" is 2, a period of the data strobe (DQS) signal of FIG. 10 may be two times the period of the data strobe signals (DQS) of FIGS. 6 to 9.

Referring to FIG. 10, the memory controller 1100 may transmit operation codes OP1 to OP8 synchronized with rising edges of the M-divided data strobe signal (DQS). As the data strobe signal (DQS) is divided by "M", a speed at which the operation codes OP1 to OP8 are transmitted may decrease to "1/M". Unlike that shown in FIG. 10, the memory controller 1100 may transmit operation codes OP1 to OP8 synchronized with falling edges of the M-divided data strobe signal. In FIG. 10, a speed at which the operation codes OP1 to OP8 are transmitted may be "BL/2×M (a division ratio)", and tMRS_SET may increase compared with the cases of FIGS. 6 to 9.

Figure 11:
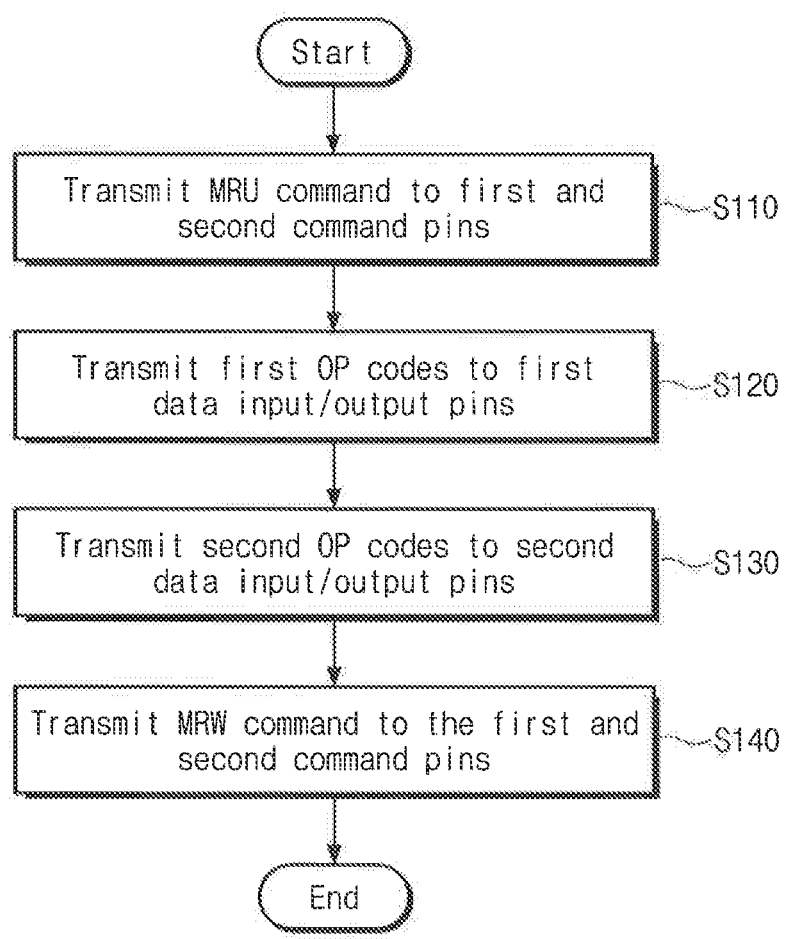
FIG. 11 is a flowchart illustrating a method of setting a memory module, according to an exemplary embodiment of the inventive concept.

FIG. 11 is a flowchart illustrating a method of setting a memory module, according to an exemplary embodiment of the inventive concept. FIG. 11 will be described with reference to FIGS. 4 and 6 to 10. In FIG. 11, it is assumed that the memory module 1200 includes the first and second memory devices 1201 and 1202. However, depending on the flowchart of FIG. 11, all the memory devices 1201 to 1220 in a rank may be set, or all memory devices of all ranks may be set.

In operation S110, the memory controller 1100 may transmit the MRU command to a first command pin (the command pin 112 of FIG. 2) of the first memory device 1201 and a second command pin of the second memory device 1202. Operation S110 may correspond to an operation at the time point T1 of FIGS. 6 to 10.

In operation S120, the memory controller 1100 may transmit first operation codes to first DQ pins (the first and second DQ pins 114 and 115 of FIG. 2) of the first memory device 1201. Here, the first operation codes may be associated with first DQ signals input or output through the first DQ pins depending on a write command or a read command. For example, the first operation codes may include first sub operation code groups respectively associated with the first DQ signals. Referring to FIGS. 6 to 10, the first sub operation code group for the first DQ signal DQ[1] may include 8 operation codes OP1 to OP8.

In operation S130, the memory controller 1100 may transmit second operation codes to second DQ pins of the second memory device 1202. Here, the second operation codes may be associated with second DQ signals input or output through the second DQ pins depending on a write command or a read command.

In an exemplary embodiment of the inventive concept, operation S120 and operation S130 may be performed at the same time. As illustrated in FIGS. 6 to 10, the memory controller 1100 may simultaneously transmit the first and second operation codes to the first memory device 1201 and the second memory device 1202.

In operation S140, the memory controller 1100 may transmit the MRW command for storing the first operation codes in the first memory device 1201 and the second operation codes in the second memory device 1202 to the first command pin of the first memory device 1201 and the second command pin of the second memory device 1202. Operation S140 may correspond to an operation at the time point T4 of FIGS. 6 to 10.

Figure 12:
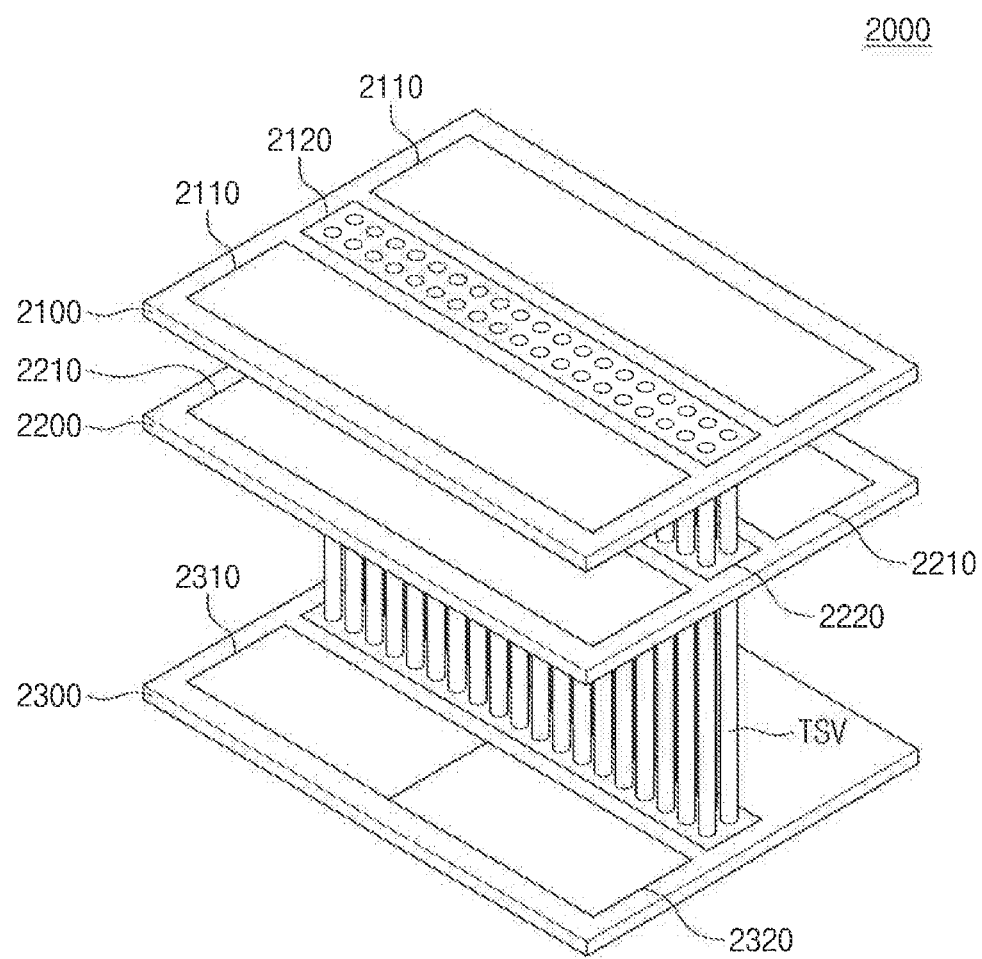
FIG. 12 is a view illustrating a memory device communicating with a memory controller of FIG. 1, according to an exemplary embodiment of the inventive concept.

FIG. 12 is a view illustrating a memory device communicating with a memory controller of FIG. 1, according to an exemplary embodiment of the inventive concept. A memory device 2000 may be a high bandwidth memory device such as HBM, HBM2, HBM3, etc. described above. The memory controller 11 may communicate with the memory device 2000 instead of the memory module 12. FIG. 12 will be described with reference to FIGS. 1 and 2. Referring to FIG. 12, the memory device 2000 may include first to third memory dies 2100, 2200 and 2300 and through silicon vias TSV. Herein the number of stacked memory dies is not limited to that illustrated in FIG. 12. For example, the first and second memory dies 2100 and 2200 may be a slave die, and the third memory die 2300 may be a master die or a buffer die.

The first memory die 2100 may include a first memory cell array 2110 corresponding to the memory cell array 151 of FIG. 2 and a first TSV area 2120 for access to the first memory cell array 2110. The second memory die 2200 may include a second memory cell array 2210 corresponding to the memory cell array 151 of FIG. 2 and a second TSV area 2220 for access to the second memory cell array 2210.

Here, the first TSV area 2120 may be an area at the first memory die 2100 where TSVs for communication between the first memory die 2100 and the third memory die 2300 are disposed. As in the above description, the second TSV area 2220 may be an area of the second memory dies 2200 where TSVs for communication between the second memory die 2200 and the third memory die 2300 are disposed.

The TSVs may provide electrical paths between the first to third memory dies 2100 to 2300. The first to third memory dies 2100 to 2300 may be electrically connected to each other by the TSVs. For example, the number of TSVs may be several hundreds to several thousands, and the TSVs may be arranged in a matrix form.

The third memory die 2300 may include a first peripheral circuit 2310 and a second peripheral circuit 2320. Here, the first peripheral circuit 2310 may include circuits (e.g., the circuitry of the memory device 100 of FIG. 2 other than the memory cell array 151) for accessing the first memory die 2100, and the second peripheral circuit 2320 may include circuits for accessing the second memory die 2200. As the number of stacked memory dies increases, the number of peripheral circuits may also increase.

In an exemplary embodiment of the inventive concept, the number of DQ pins of the memory device 2000 may be at least 1024 or more. According to the setting methods of FIGS. 6 to 10, a time taken to set DQ signals may be irrelevant to the number of DQ pins (the number of DQ signals) and the number of memory devices in the same rank. Accordingly, in the case of a memory device including a plurality of DQ pins like the memory device 2000, the setting methods illustrated in FIGS. 6 to 10 may be used instead of the setting method illustrated in FIG. 5 for setting DQ signals independently.

Figure 13:
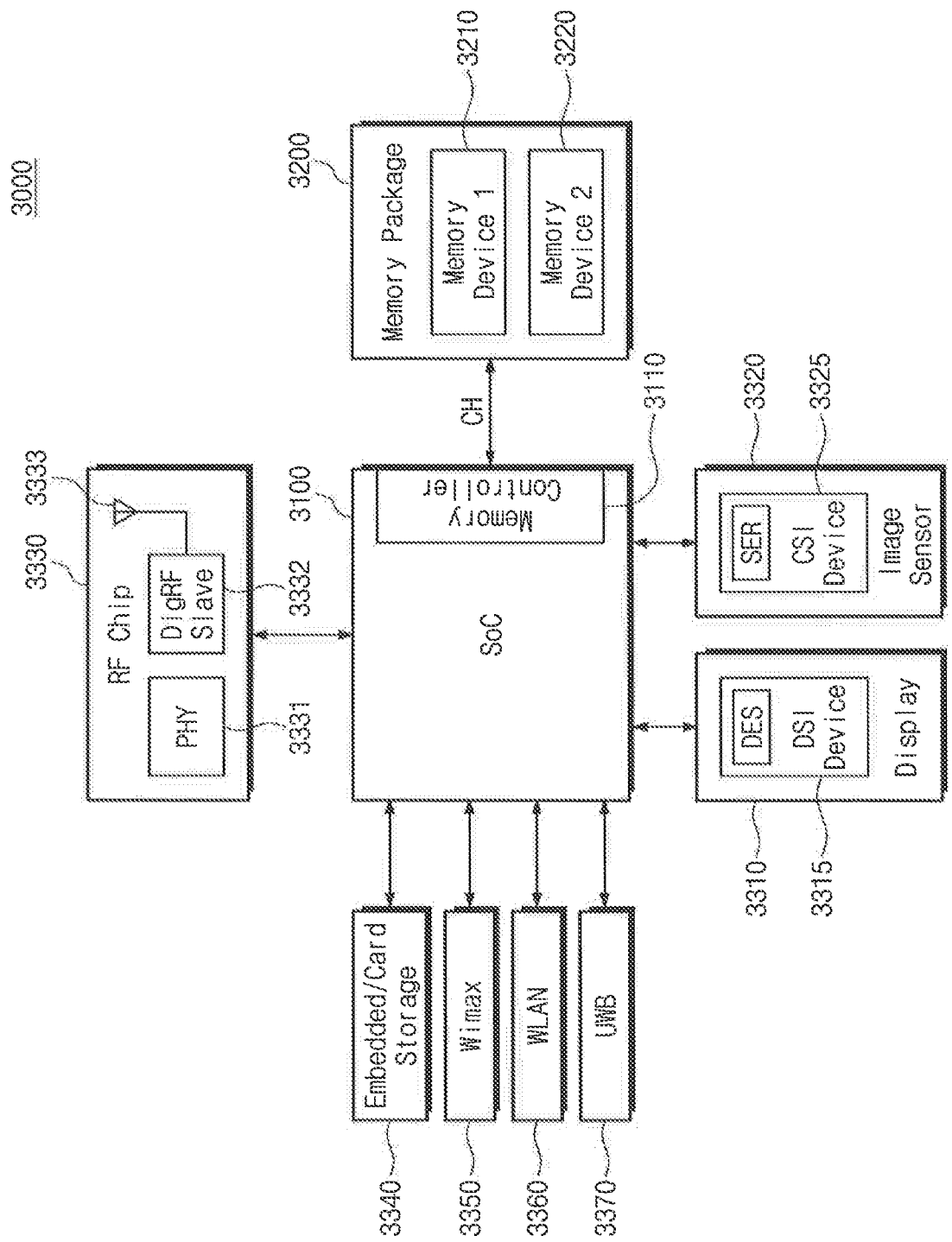
FIG. 13 is a block diagram illustrating an electronic device in which a memory system according to an exemplary embodiment of the inventive concept is implemented.

FIG. 13 is a block diagram illustrating an electronic device in which a memory system according to an exemplary embodiment of the inventive concept is implemented. An electronic device 3000 may be an electronic device capable of using or supporting interfaces developed by the mobile industry processor interface (MIPI) alliance. For example, the electronic device 3000 may be, but is not limited to, a server, a computer, a smartphone, a tablet, personal digital assistant (PDA), a digital camera, a portable multimedia player (PMP), a wearable device, an Internet of Things (IoT) device, or the like.

The electronic device 3000 may include a system on chip (SoC) 3100 and a memory package 3200. The SoC 3100 may include a processor for executing a program that the electronic device 3000 supports and memory controllers described with reference to FIGS. 1 and 4. The memory package 3200 may include a first memory device 3210 and a second memory device 3220, and the first memory device 3210 and the second memory device 3220 may be the memory device 100 of FIG. 2. The memory package 3200 may communicate with the SoC 3100 via a channel CH. The number of memory devices included in the memory package 3200 is not limited to illustration of FIG. 13. The memory package 3200 may be the memory modules 200, 1200, and 1300 of FIGS. 3 and 4 or may be the memory device 2000 of FIG. 12.

The electronic device 3000 may include a display 3310 for communicating with the SoC 3100. The SoC 3100 may communicate with a display serial interface (DSI) device 3315 through a DSI. For example, an optical deserializer DES may be implemented in the DSI device 3315.

The electronic device 3000 may include an image sensor 3320 for communicating with the SoC 3100. The SoC 3100 may communicate with a camera serial interface (CSI) device 3325 through a CSI. For example, an optical serializer SER may be implemented in the CSI device 3325.

The electronic device 3000 may further include a radio frequency (RF) chip 3330 that communicates with the SoC 3100. The RF chip 3330 may include a physical layer 3331, a DigRF slave 3332, and an antenna 3333. For example, the physical layer 3331 of the RF chip 3330 and the SoC 3100 may exchange data with each other through a DigRF interface developed by the MIPI alliance.

The electronic device 3000 may further include embedded/card storage 3340. The embedded/card storage 3340 may store data provided from the SoC 3100 and may permanently store data provided from the memory package 3200. The electronic device 3000 may communicate with an external system through worldwide interoperability for microwave access (WiMAX) 3350, a wireless local area network (WLAN) 3360, ultra wide band (UWB) 3370, and the like. In addition to the components illustrated in FIG. 13, any other components (e.g., a speaker, a microphone, a global positioning system (GPS), etc.) may be further included in the electronic device 3000.

According to an exemplary embodiment of the inventive concept, since a memory device receives operation codes through DQ pins, a time taken to set modes of operation of the memory device, in other words, a time taken to set mode registers may decrease.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device, comprising:
   a memory cell array;
   a first DQ pin through which a first signal is input or output, wherein the first signal comprises first bits to be written in the memory cell array or output from the memory cell array;
   a second DQ pin through which a second signal is input or output, wherein the second signal comprises second bits to be written in the memory cell array or output from the memory cell array;
   a first receiver configured to receive first operation codes for the first signal through the first DQ pin;
   a second receiver configured to receive second operation codes for the second signal through the second DQ pin;
   a first mode register configured to store the first operation codes received by the first receiver connected to the first DQ pin; and
   a second mode register configured to store the second operation codes received by the second receiver connected to the second DQ pin.

2. The memory device of claim 1, wherein the first receiver is further configured to receive the first signal based on the first operation codes stored in the first mode register, and
   wherein the second receiver is further configured to receive the second signal based on the second operation codes stored in the second mode register.

3. The memory device of claim 2, further comprising:
   a first decision feedback equalizer (DFE) configured to generate a first reference signal by using the first operation codes and provide the first reference signal to the first receiver; and
   a second DFE configured to generate a second reference signal by using the second operation codes and provide the second reference signal to the second receiver,
   wherein the first receiver is further configured to compare the first signal with the first reference signal, and
   wherein the second receiver is further configured to compare the second signal with the second reference signal.

4. The memory device of claim 1, further comprising:
   a command pin for receiving a mode register update command before the first operation codes are transmitted to the first DQ pin and the second operation codes are transmitted to the second DQ pin.

5. The memory device of claim 4, wherein, at a second time point following a first time point when all the first operation codes are transmitted to the first DQ pin and all the second operation codes are transmitted to the second DQ pin, the command pin further receives a mode register write command for storing the first operation codes in the first mode register and the second operation codes in the second mode register.

6. The memory device of claim 5, wherein the mode register update command and the mode register write command are synchronized with a clock signal, and
   wherein an interval between the first time point and the second time point is based on a period of the clock signal or a delay time.

7. The memory device of claim 4, further comprising:
   a first deserializer configured to deserialize the first operation codes; and
   a second deserializer configured to deserialize the second operation codes.

8. The memory device of claim 7, wherein the command pin further receives a write command for storing the first bits and the second bits,
   wherein the first deserializer is further configured to deserialize the first bits, and
   wherein the second deserializer is further configured to deserialize the second bits.

9. The memory device of claim 8, further comprising:
   a first demultiplexer configured to:
   transmit the first operation codes deserialized by the first deserializer to the first mode register in response to the mode register update command, or
   transmit the first bits deserialized by the first deserializer to the memory cell array in response to the write command.

10. The memory device of claim 1, further comprising:
    a data strobe pin for receiving a data strobe signal,
    wherein the first receiver is further configured to sample the first operation codes at rising edges or falling edges of the data strobe signal, and
    wherein the second receiver is further configured to sample the second operation codes at the rising edges or the falling edges of the data strobe signal.

11. A memory module, comprising:
    a first memory device comprising a first memory cell array and first DQ pins through which first signals are input or output, wherein the first signals comprise first bits to be written in the first memory cell array or output from the first memory cell array; and
    a second memory device comprising a second memory cell array and second DQ pins through which second signals are input or output, wherein the second signals comprise second bits to be written in the second memory cell array or output from the second memory cell array,
    wherein the first memory device is configured to store first operation codes transmitted through the first DQ pins, in response to a mode register update command, and
    wherein the second memory device is configured to store second operation codes transmitted through the second DQ pins, in response to the mode register update command.

12. The memory module of claim 11, wherein the first memory device further comprises:

first receivers configured to respectively receive the first signals through the first DQ pins, based on the stored first operation codes, and the second memory device further comprises:

second receivers configured to respectively receive the second signals through the second DQ pins, based on the stored second operation codes.

13. The memory module of claim 12, wherein the first operation codes comprise respective first sub operation code groups for the first signals, wherein the first receivers are configured to receive the first signals based on the respective first sub operation code groups, wherein the second operation codes comprise respective second sub operation code groups for the second signals, and wherein the second receivers are configured to receive the second signals based on the respective second sub operation code groups.

14. The memory module of claim 13, wherein the first memory device further comprises:

first decision feedback equalizers (DFEs) configured to generate first reference signals and provide the first reference signals to the first receivers, respectively, wherein the first DFEs are further configured to respectively generate the first reference signals by using the respective first sub operation code groups, wherein the second memory device further comprises:

second DFEs configured to generate second reference signals and provide the second reference signals to the second receivers, respectively; and wherein the second DFEs are further configured to respectively generate the second reference signals by using the respective second sub operation code groups.

15. The memory module of claim 13, wherein the first memory device further comprises:

first transmitters configured to respectively transmit the first signals through the first DQ pins, based on the stored first operation codes, and wherein the second memory device further comprises:

second transmitters configured to respectively transmit the second signals through the second DQ pins, based on the stored second operation codes.

16. The memory module of claim 15, wherein the first transmitters are further configured to respectively transmit the first signals based on the respective first sub operation code groups, wherein the second transmitters are further configured to respectively transmit the second signals based on the respective second sub operation code groups.

17. A memory device, comprising:

a command pin for receiving a mode register update command at a first time point;

a DQS pin for receiving a data strobe signal at a second time point after the first time point;

a DQ pin for receiving an operation code at the second time point; and a mode register for storing the operation code received through the DQ pin, wherein the command pin receives a mode register write command at a third time point after the second time point, and the mode register stores the operation code based on a logical state of the data strobe signal at the third time point, and the mode register write command at the third time point.

18. The memory device of claim 17, further comprising:

a receiver connected to the DQ pin;

a deserializer connected to the receiver;

a demultiplexer connected to the deserializer, the mode register and a data buffer; and a decision feedback equalizer connected between the receiver and the mode register.

19. The memory device of claim 18, further comprising:

a transmitter connected to the DQ pin; and a serializer connected between the command pin and the data buffer.

20. The memory device of claim 18, wherein the mode register stores a setting value corresponding to the operation code, generates a set signal by using the setting value and provides the set signal to the decision feedback equalizer.

* * * * *